(12) United States Patent
Ma (10) Patent No.: US 10,019,949 B2
(45) Date of Patent: Jul. 10, 2018

(54) SHIFT REGISTER UNIT, GATE DRIVING CIRCUIT, DISPLAY PANEL AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/529,532

(22) PCT Filed: Sep. 6, 2016

(86) PCT No.: PCT/CN2016/098180
§ 371 (c)(1),
(2) Date: May 25, 2017

(87) PCT Pub. No.: WO2017/121133
PCT Pub. Date: Jul. 20, 2017

(65) Prior Publication Data
US 2018/0075923 A1    Mar. 15, 2018

(30) Foreign Application Priority Data

Jan. 15, 2016 (CN) .......................... 2016 1 0028511

(51) Int. Cl.
*G09G 3/3266* (2016.01)
*G11C 19/28* (2006.01)
*G11C 19/18* (2006.01)

(52) U.S. Cl.
CPC ......... *G09G 3/3266* (2013.01); *G11C 19/184* (2013.01); *G11C 19/28* (2013.01); *G09G 2310/0286* (2013.01)

(58) Field of Classification Search
CPC ............... G09G 3/3208; G09G 3/3266; G09G 2310/0286; G11C 19/18–19/186; G11C 19/28
See application file for complete search history.

(56) References Cited

U.S. PATENT DOCUMENTS 7,652,645 B2 *  1/2010  Park ..................... G09G 3/3266
                                                        345/100
9,236,008 B2    1/2016  Liu
(Continued)

FOREIGN PATENT DOCUMENTS

CN         1758321 A       4/2006
CN       101939791 A       1/2011
(Continued)

OTHER PUBLICATIONS

International Search Report from International Application No. PCT/CN2016/098180 dated Dec. 12, 2016.

*Primary Examiner* — Patrick O'Neill
(74) *Attorney, Agent, or Firm* — Calfee, Halter & Griswold LLP (57) ABSTRACT

A shift register unit, a gate drive circuit, a display panel and a display device are disclosed. The shift register unit combines a light emission signal output module with a scanning signal output module, i.e. integrating a light emission shift register unit and a scanning shift register unit into a circuit, thereby reducing the number of clock signals as required. The light emission signal output module and the scanning signal output module may be synchronously driven. The light emission signal output module continuously outputs a first reference signal or a second reference signal by controlling potentials of a first and fifth node. The scanning signal output module continuously outputs the second reference signal or a second clock signal by controlling potentials of a third and fourth node, thereby generating a light (Continued)

emission signal having multiple pulse widths, i.e. effecting duty ratio control to the light emission signal.

20 Claims, 4 Drawing Sheets

(56) References Cited

U.S. PATENT DOCUMENTS

| | | | | |
|---|---|---|---|---|
| 9,412,306 B2* | 8/2016 | Kim | ............... | G09G 3/3208 |
| 9,443,464 B2* | 9/2016 | Song | ............... | G09G 3/3266 |
| 9,454,935 B2* | 9/2016 | Park | ............... | G09G 3/3233 |
| 9,524,675 B2* | 12/2016 | Wei | ............... | G09G 3/3233 |
| 9,646,535 B2* | 5/2017 | Yoon | ............... | G09G 3/3233 |
| 9,805,657 B2* | 10/2017 | Kwon | ............... | G09G 3/3266 |
| 9,830,850 B2* | 11/2017 | Sun | ............... | G09G 3/2092 |
| 2011/0193892 A1 | 8/2011 | Eom | | |

FOREIGN PATENT DOCUMENTS

| | | |
|---|---|---|
| CN | 104900268 A | 9/2015 |
| CN | 105096889 A | 11/2015 |
| CN | 105702295 A | 6/2016 |

* cited by examiner

SHIFT REGISTER UNIT, GATE DRIVING CIRCUIT, DISPLAY PANEL AND DISPLAY DEVICE

CROSS-REFERENCE TO RELATED APPLICATIONS

The present application is the U.S. national phase entry of PCT/CN2016/098180, with an international filling date of Sep. 6, 2016, which claims the benefit of Chinese Patent Application NO. 201610028511.3, filed on Jan. 15, 2016, the entire disclosure of which is incorporated herein by reference.

TECHNICAL FIELD

The present disclosure relates to the field of display technology, and particularly to a shift register unit, a gate drive circuit, a display panel and a display device.

BACKGROUND

Organic Light Emitting Diode (OLED) display is a research hot spots in the field of flat panel display. As compared with liquid crystal displays (LCDs), OLED displays have the advantages of low energy consumption, low production cost, self-luminescence, wide viewing angle and rapid response. OLED display screens have gradually replaced traditional LCD screens in display fields such as cellphones, PDAs, digital cameras. An organic light emitting display panel needs to be controlled by an integrated circuit (IC), for example, a gate drive circuit controls a display panel to effect progressive scanning and frame updating such that image data inputted into the display panel can be updated in real time so as to realize dynamic display. A light emission drive circuit is used to provide light emission signals to the display panel so as to control OLEDs in various pixels to emit light during the light emission period. Usually, a gate drive circuit and a light emission drive circuit are separate circuits that are independently designed, with the gate drive circuit comprising a plurality of scanning shift register units and the light emission drive circuit comprising a plurality of light emission shift register units.

SUMMARY

A shift register unit is provided in an exemplary embodiment of the present disclosure. The shift register unit comprises a first input module, a second input module, a first control module, a second control module, a light emission signal output module and a scanning signal output module. The first input module has a first control terminal and a first input terminal that are respectively connected to a first clock signal, a second control terminal and a first output terminal that are respectively connected to a first node, a second input terminal that is connected to a first signal, a third input terminal that is connected to a first reference signal, and a second output terminal that is connected to a second node. The first input module is configured to output the first signal and the first reference signal respectively to the first node and the second node under the control of the first clock signal, and output the first clock signal to the second node under the control of the first node. The second input module has a first control terminal and a first input terminal that are respectively connected to the first clock signal, a second control terminal and a first output terminal that are respectively connected to a third node, a second input terminal that is connected to a second signal, a third input terminal that is connected to the first reference signal, and a second output terminal that is connected to a fourth node. The second input module is configured to output the second signal and the first reference signal respectively to the third node and the fourth node under the control of the first clock signal, and output the first clock signal to the fourth node under the control of the third node. The first control module has a first control terminal that is connected to the second node, a second control terminal that is connected to a second clock signal, a third control terminal that is connected to the first node, a first input terminal that is connected to a second reference signal, a second input terminal that is connected to the first reference signal, and an output terminal that is connected to a fifth node. The first control module is configured to output the first reference signal to the fifth node under the control of the second node and the second clock signal, and output the second reference signal to the fifth node under the control of the first node. The second control module has a first control terminal that is connected to the fourth node, a second control terminal that is connected to the first node, a third control terminal that is connected to the fifth node, an input terminal that is connected to the second reference signal, and an output terminal that is connected to the third node. The second control module is configured to output the second reference signal to the third node under the control of the fourth node, the first node and the fifth node. The light emission signal output module has a first control terminal that is connected to the first node, a second control terminal that is connected to the fifth node, a first input terminal that is connected to the first reference signal, a second input terminal that is connected to the second reference signal, and a light emission signal output terminal. The light emission signal output module is configured to output one of the first reference signal and the second reference signal to the light emission signal output terminal under the control of the first node and the fifth node. The scanning signal output module has a first control terminal that is connected to the third node, a second control terminal that is connected to the fourth node, a first input terminal that is connected to the second reference signal, a second input terminal that is connected to the second clock signal, and a scanning signal output terminal. The scanning signal output module is configured to output one of the second reference signal and the second clock signal to the scanning signal output terminal under the control of the third node and the fourth node.

In an exemplary embodiment, the light emission signal output module comprises a first output unit and a second output unit. The first output unit has a control terminal that acts as the second control terminal of the light emission signal output module, and an input terminal that acts as the second input terminal of the light emission signal output module. The first output unit is configured to output the second reference signal to the light emission signal output terminal under the control of the fifth node. The second output unit has a control terminal that acts as the first control terminal of the light emission signal output module, and an input terminal that acts as the first input terminal of the light emission signal output module. The second output unit is configured to output the first reference signal to the light emission signal output terminal under the control of the first node.

In an exemplary embodiment, the first output unit comprises a first switch transistor and a first capacitor. The first switch transistor has a gate connected to the fifth node, a source connected to the second reference signal, and a drain connected to the light emission signal output terminal, and the first capacitor is connected between the second reference signal and the fifth node.

In an exemplary embodiment, the second output unit comprises a second switch transistor and a second capacitor. The second switch transistor has a gate connected to the first node, a source connected to the first reference signal, and a drain connected to the light emission signal output terminal, and the second capacitor is connected between the first node and the light emission signal output terminal.

In an exemplary embodiment, the scanning signal output module comprises a third output unit and a fourth output unit. The third output unit has a control terminal that acts as the second control terminal of the scanning signal output module, and an input terminal that acts as the first input terminal of the scanning signal output module. The third output unit is configured to output the second reference signal to the scanning signal output terminal under the control of the fourth node. The fourth output unit has a control terminal that acts as the first control terminal of the scanning signal output module, and an input terminal that acts as the second input terminal of the scanning signal output module. The fourth output unit is configured to output the second clock signal to the scanning signal output terminal under the control of the third node.

In an exemplary embodiment, the third output unit comprises a third switch transistor and a third capacitor. The third switch transistor has a gate connected to the fourth node, a source connected to the second reference signal, and a drain connected to the scanning signal output terminal, and the third capacitor is connected between the fourth node and the second reference signal.

In an exemplary embodiment, the fourth output unit comprises a fourth switch transistor and a fourth capacitor. The fourth switch transistor has a gate connected to the third node, a source connected to the second clock signal, and a drain connected to the scanning signal output terminal, and the fourth capacitor is connected between the third node and the scanning signal output terminal.

In an exemplary embodiment, the first control module comprises a first control unit and a second control unit. The first control unit has a first control terminal and a second terminal that respectively act as the first control terminal and the second control terminal of the first control module, and an input terminal that acts as the second input terminal of the first control module. The first control unit is configured to output the first reference signal to the fifth node under the control of the second node and the second clock signal. The second control unit has a control terminal that acts as the third control terminal of the first control module, and an input terminal that acts as the first input terminal of the first control module. The second control unit is configured to output the second reference signal to the fifth node under the control of the first node.

In an exemplary embodiment, the first control unit comprises a fifth switch transistor, a sixth switch transistor and a fifth capacitor. The fifth switch transistor has a gate connected to the second node, a source connected to the first reference signal, and a drain connected to a source of the sixth switch transistor, the sixth switch transistor has a gate connected to the second clock signal and a drain connected to the fifth node. The fifth capacitor is connected between the second node and the second clock signal.

In an exemplary embodiment, the second control unit comprises a seventh switch transistor, which has a gate connected to the first node, a source connected to the second reference signal and a drain connected to the fifth node.

In an exemplary embodiment, the first input module comprises a first input unit and a second input unit. The first input unit has a control terminal that acts as the first control terminal of the first input module, a first input terminal that acts as the third input terminal of the first input module, and a second input terminal that acts as the second input terminal of the first input module. The first input unit is configured to output the first signal and the first reference signal respectively to the first node and the second node under the control of the first clock signal. The second input unit has a control terminal that acts as the second control terminal of the first input module, and an input terminal that acts as the first input terminal of the first input module. The second input unit is configured to output the first clock signal to the second node under the control of the first node.

In an exemplary embodiment, the first input unit comprises an eighth switch transistor and a ninth switch transistor. The eighth switch transistor has a gate connected to the first clock signal, a source connected to the first signal, and a drain connected to the first node. The ninth switch transistor has a gate connected to the first clock signal, a source connected to the first reference signal, and a drain connected to the second node.

In an exemplary embodiment, the second input unit comprises a tenth switch transistor which has a gate connected to the first node, a source connected to the first clock signal, and a drain connected to the second node.

In an exemplary embodiment, the second input module comprises a third input unit and a fourth input unit. The third input unit has a control terminal that acts as the first control terminal of the second input module, a first input terminal that acts as the third input terminal of the second input module, and a second input terminal that acts as the second input terminal of the second input module. The third input unit is configured to output the second signal and the first reference signal respectively to the third node and the fourth node under the control of the first clock signal. The fourth input unit has a control terminal that acts as the second control terminal of the second input module, and an input terminal that acts as the first input terminal of the second input module. The fourth input unit is configured to output the first clock signal to the fourth node under the control of the third node.

In an exemplary embodiment, the third input unit comprises an eleventh switch transistor and a twelfth switch transistor. The eleventh switch transistor has a gate connected to the first clock signal, a source connected to the second signal, and a drain connected to the third node. The twelfth switch transistor has a gate connected to the first clock signal, a source connected to the first reference signal, and a drain connected to the fourth node.

In an exemplary embodiment, the fourth input unit comprises a thirteenth switch transistor which has a gate connected to the third node, a source connected to the first clock signal, and a drain connected to the fourth node.

In an exemplary embodiment, the second control module comprises a fourteenth switch transistor, a fifteenth switch transistor and a sixteenth switch transistor. The fourteenth switch transistor has a gate connected to the fourth node, a source connected to the second reference signal, and a drain connected to a source of the fifteenth switch transistor and a source of the sixteenth switch transistor respectively. The fifteenth switch transistor has a gate connected to the first node and a drain connected to the third node. The sixteenth switch transistor has a gate connected to the fifth node and a drain connected to the third node.

Another exemplary embodiment of the disclosure provides a gate drive circuit, comprising a plurality of cascaded shift register units according to any one of the above exemplary embodiments. Among the cascaded shift register units, apart from the last shift register unit, the light emission signal output terminal of each shift register unit is connected to a next subsequent shift register unit to provide the first signal for this next subsequent shift register unit, the scanning signal output terminal of each shift register unit is connected to a next subsequent shift register unit to provide the second signal for this next subsequent shift register unit.

In an exemplary embodiment, the first signal and the second signal that are provided to a first shift register unit among the cascaded shift register units are a first trigger signal for generating the light emission signal and a second trigger signal for generating the scanning signal, respectively.

A further exemplary embodiment of the disclosure provides a display panel, comprising the gate drive circuit according to the above exemplary embodiment.

A further exemplary embodiment of the disclosure provides a display device, comprising the display panel according to the above exemplary embodiment.

A shift register unit, a gate drive circuit, a display panel and a display device are provided in the exemplary embodiments of the disclosure. The shift register unit comprises a first input module, a second input module, a first control module, a second control module, a light emission signal output module and a scanning signal output module. The first input module is configured to output the first signal and the first reference signal respectively to the first node and the second node under the control of the first clock signal, and output the first clock signal to the second node under the control of the first node. The second input module is configured to output the second signal and the first reference signal respectively to the third node and the fourth node under the control of the first clock signal, and output the first clock signal to the fourth node under the control of the third node. The first control module is configured to output the first reference signal to the fifth node under the control of the second node and the second clock signal, and output the second reference signal to the fifth node under the control of the first node. The second control module is configured to output the second reference signal to the third node under the control of the fourth node, the first node and the fifth node. The light emission signal output module is configured to output one of the first reference signal and the second reference signal to the light emission signal output terminal under the control of the first node and the fifth node. The scanning signal output module is configured to output one of the second reference signal and the second clock signal to the scanning signal output terminal under the control of the third node and the fourth node.

DETAILED DESCRIPTION OF EMBODIMENTS

Specific embodiments of a shift register unit, a gate drive circuit, a display panel and a display device as provided in the present disclosure will be described below in detail in conjunction with the appended drawings.

Figure 1:
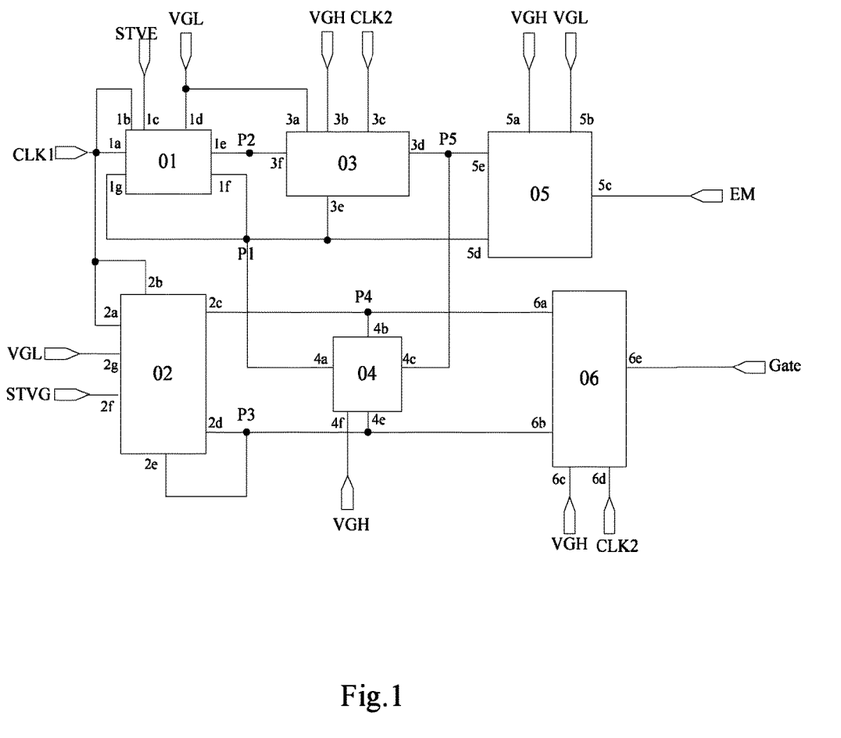
FIG. 1 schematically shows a structural diagram of a shift register unit as provided in an exemplary embodiment of the present disclosure.

A shift register unit provided in an exemplary embodiment of the disclosure, as shown in FIG. 1, may comprise a first input module 01, a second input module 02, a first control module 03, a second control module 04, a light emission signal output module 05 and a scanning signal output module 06.

In the exemplary embodiment shown in FIG. 1, the first input module 01 has a first control terminal 1a and a first input terminal 1b that are respectively connected to a first clock signal CLK1, a second control terminal 1g and a first output terminal 1f that are respectively connected to a first node P1, a second input terminal 1c that is connected to a first signal STVE, a third input terminal 1d that is connected to a first reference signal VGL, and a second output terminal 1e that is connected to a second node P2. The first input module 01 is configured to output the first signal STVE and the first reference signal VGL respectively to the first node P1 and the second node P2 under the control of the first clock signal CLK1, and output the first clock signal CLK1 to the second node P2 under the control of the first node P1.

The second input module 02 has a first control terminal 2a and a first input terminal 2b that are respectively connected to the first clock signal CLK1, a second control terminal 2d and a first output terminal 2e that are respectively connected to a third node P3, a second input terminal 2f that is connected to a second signal STVG, a third input terminal 2g that is connected to the first reference signal VGL, and a second output terminal 2c that is connected to a fourth node P4. The second input module 02 is configured to output the second signal STVG and the first reference signal VGL respectively to the third node P3 and the fourth node P4 under the control of the first clock signal CLK1, and output the first clock signal CLK1 to the fourth node P4 under the control of the third node P3.

The first control module 03 has a first control terminal 3f that is connected to the second node P2, a second control terminal 3c that is connected to a second clock signal CLK2, a third control terminal 3e that is connected to the first node P1, a first input terminal 3b that is connected to a second reference signal VGH, a second input terminal 3a that is connected to the first reference signal VGL, and an output terminal 3d that is connected to a fifth node P5. The first control module 03 is configured to output the first reference signal VGL to the fifth node P5 under the control of the second node P2 and the second clock signal CLK2, and output the second reference signal VGH to the fifth node P5 under the control of first node P1.

The second control module 04 has a first control terminal 4b that is connected to the fourth node P4, a second control terminal 4a that is connected to the first node P1, a third control terminal 4c that is connected to the fifth node P5, an input terminal 4f that is connected to the second reference signal VGH, and an output terminal 4e that is connected to the third node P3. The second control module 04 is configured to output the second reference signal VGH to the third node P3 under the control of the fourth node P4, the first node P1 and the fifth node P5.

The light emission signal output module 05 has a first control terminal 5d that is connected to the first node P1, a second control terminal 5e that is connected to the fifth node P5, a first input terminal 5b that is connected to the first reference signal VGL, a second input terminal 5a that is connected to the second reference signal VGH, and an output terminal 5c that acts as a light emission signal output terminal for outputting a light emission signal EM. The light emission signal output module 05 is configured to output the first reference signal VGL or the second reference signal VGH to the light emission signal output terminal 5c under the control of the first node P1 and the fifth node P5.

The scanning signal output module 06 has a first control terminal 6b that is connected to the third node P3, a second control terminal 6a that is connected to the fourth node P4, a first input terminal 6c that is connected to the second reference signal VGH, a second input terminal 6d that is connected to the second clock signal CLK2, and an output terminal 6e that acts as a scanning signal output terminal for outputting scanning signals Gate. The scanning signal output module 06 is configured to output the second reference signal VGH or the second clock signal CLK2 to the scanning signal output terminal 6e under the control of the third node P3 and the fourth node P4.

Figure 2:
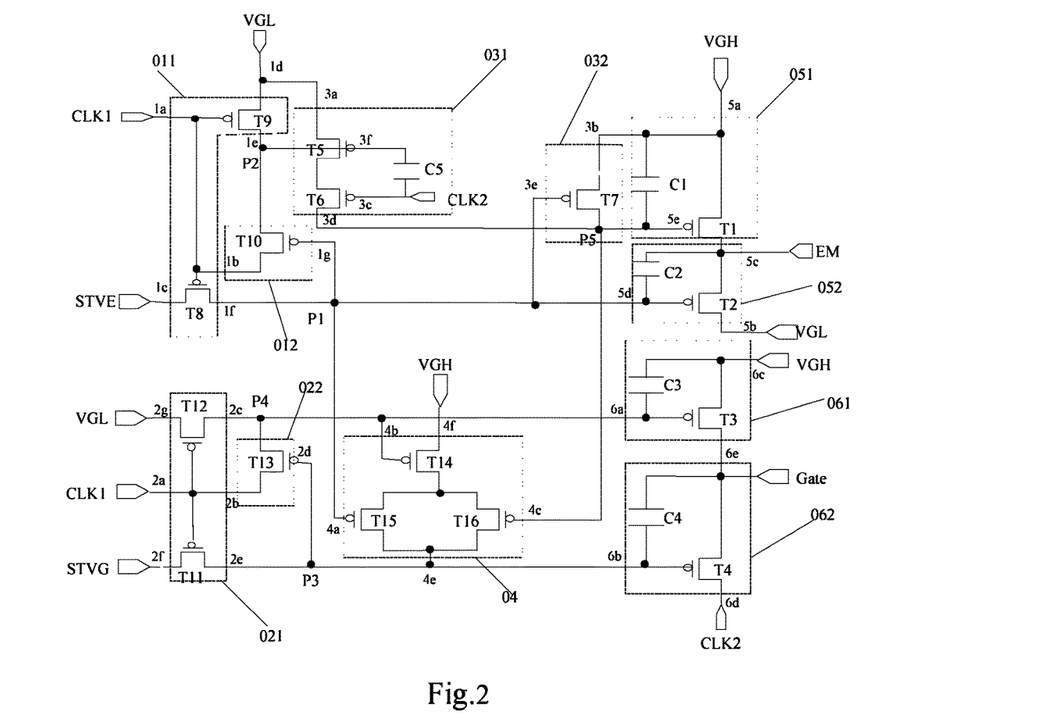
FIG. 2 schematically shows a specific circuitry of a shift register unit as provided in an exemplary embodiment of the present disclosure.

According to an exemplary embodiment of the shift register unit of the disclosure, as shown in FIG. 2, the light emission signal output module may comprise a first output unit 051 and a second output unit 052. The first output unit 051 has a control terminal 5e that is connected to the fifth node P5, an input terminal 5a that is connected to the second reference signal VGH, and an output terminal 5c that acts as the light emission signal output terminal. The first output unit 051 is configured to output the second reference signal VGH to the light emission signal output terminal 5c under the control of the fifth node P5. The second output unit 052 has a control terminal 5d that is connected to the first node P1, an input terminal 5b that is connected to the first reference signal VGL, and an output terminal that is connected to the light emission signal output terminal 5c. The second output unit 052 is configured to output the first reference signal VGL to the light emission signal output terminal 5c under the control of the first node P1. As the light emission signal output module comprises the first output unit and the second output unit, the first reference signal may be continuously outputted by the second output unit under the control of the first node, and the second reference signal may be continuously outputted by the first output unit under the control of the fifth node.

In the shift register unit as provided in an exemplary embodiment of the present disclosure, as shown in FIG. 2, the first output unit 051 may comprise a first switch transistor T1 and a first capacitor C1. The first switch transistor T1 has a gate connected to the fifth node P5, a source connected to the second reference signal VGH, and a drain connected to the light emission signal output terminal. The first capacitor C1 is connected between the second reference signal VGH and the fifth node P5. In this way, the first switch transistor may be turned on under the control of the fifth node, so as to output the second reference signal to the light emission signal output terminal.

In the shift register unit as provided in an exemplary embodiment of the disclosure, as shown in FIG. 2, the second output unit 052 may comprise a second switch transistor T2 and a second capacitor C2. The second switch transistor T2 has a gate connected to the first node P1, a source connected to the first reference signal VGL, and a drain connected to the light emission signal output terminal 5c. The second capacitor C2 is connected between the first node P1 and the light emission signal output terminal. In this way, the second switch transistor can be turned on under the control of the first node, so as to output the first reference signal to the light emission signal output terminal.

In the shift register unit as provided in an exemplary embodiment of the present disclosure, as shown in FIG. 2, the scanning signal output module may comprise a third output unit 061 and a fourth output unit 062. The third output unit 061 has a control terminal 6a that is connected to the fourth node P4, an input terminal 6c that is connected to the second reference signal VGH, and an output terminal 6e that acts as a scanning signal output terminal for providing scanning signals Gate. The third output unit 061 is configured to output the second reference signal VGH to the scanning signal output terminal 6e under the control of the fourth node P4. The fourth output unit 062 has a control terminal 6b that is connected to the third node P3, an input terminal 6d that is connected to the second clock signal CLK2, and an output terminal that is connected to the scanning signal output terminal 6e. The fourth output unit 062 is configured to output the second clock signal CLK2 to the scanning signal output terminal 6e under the control of the third node P3. As the scanning signal output module comprises the third output unit and the fourth output unit, the second reference signal can be continuously outputted by the third output unit under the control of the fourth node, and the second clock signal can be continuously outputted by the fourth output unit under the control of the third node.

In the shift register unit as provided in an exemplary embodiment of the disclosure, as shown in FIG. 2, the third output unit may comprise a third switch transistor T3 and a third capacitor C3. The third switch transistor T3 has a gate connected to the fourth node P4, a source connected to the second reference signal VGH, and a drain connected to the scanning signal output terminal. The third capacitor C3 is connected between the fourth node P4 and the second reference signal VGH. In this way, the third switch transistor may be turned on under the control of the fourth node, so as to output the second reference signal to the scanning signal output terminal.

In the shift register unit as provided in an exemplary embodiment of the present disclosure, as shown in FIG. 2, the fourth output unit may comprise a fourth switch transistor T4 and a fourth capacitor C4. The fourth switch transistor T4 has a gate connected to the third node P3, a source connected to the second clock signal CLK2, and a drain connected to the scanning signal output terminal. The fourth capacitor C4 is connected between the third node P3 and the scanning signal output terminal. Thus, the fourth switch transistor can be turned on under the control of the third node, so as to output the second clock signal to the scanning signal output terminal.

In the shift register unit as provided in an exemplary embodiment of the present disclosure, as shown in FIG. 2, the first control module may comprise a first control unit 031 and a second control unit 032. The first control unit 031 has a first control terminal 3f that is connected to the second node P2, a second control terminal 3c that is connected to the second clock signal CLK2, an input terminal 3a that is connected to the first reference signal VGL, and an output terminal 3d that is connected to the fifth node P5. The first control unit 031 is configured to output the first reference signal VGL to the fifth node P5 under the control of the second node P2 and the second clock signal CLK2. The second control unit 032 has a control terminal 3e that is connected to the first node P1, an input terminal 3b that is connected to the second reference signal VGH, and an output terminal that is connected to the fifth node P5. The second control unit 032 is configured to output the second reference signal VGH to the fifth node P5 under the control of the first node P1. As the first control module comprises the first control unit and the second control unit, the first reference signal can be output by the first control unit to the fifth node under the control of the second node and the second clock signal, and the second reference signal can be output by the second control unit to the fifth node under the control of the first node.

In the shift register unit as provided in an exemplary embodiment of the disclosure, as shown in FIG. 2, the first control unit may comprise a fifth switch transistor T5, a sixth switch transistor T6 and a fifth capacitor C5. The fifth switch transistor T5 has a gate connected to the second node P2, a source connected to the first reference signal VGL, and a drain connected to a source of the sixth switch transistor T6. The sixth switch transistor T6 has a gate connected to the second clock signal CLK2, and a drain connected to the fifth node P5. The fifth capacitor C5 is connected between the second node P2 and the second clock signal CLK2. Thus, the fifth switch transistor may be turned on under the control of the second node, so that the first reference signal can be outputted to the source of the sixth switch transistor. The sixth switch transistor may be turned on under the control of the second clock signal, so that the signal at the source thereof can be provided to the fifth node.

In the shift register unit as provided in an exemplary embodiment of the present disclosure, as shown in FIG. 2, the second control unit may comprise a seventh switch transistor T7, which has a gate connected to the first node P1, a source connected to the second reference signal VGH and a drain connected to the fifth node P5. Thus, the seventh switch transistor may be turned on under the control of the first node, so as to provide the second clock signal to the fifth node.

In the shift register unit as provided in an exemplary embodiment of the present disclosure, as shown in FIG. 2, the first input module may comprise a first input unit 011 and a second input unit 012. The first input unit 011 has a control terminal 1a that is connected to the first clock signal CLK1, a first input terminal 1d that is connected to the first reference signal VGL, a second input terminal 1c that is connected to the first signal STVE, a first output terminal 1f that is connected to the first node P1, and a second output terminal 1e that is connected to the second node P2. The first input unit 011 is configured to output the first signal STVE and the first reference signal VGL respectively to the first node P1 and the second node P2 under the control of the first clock signal CLK1. The second input unit 012 has a control terminal 1g that is connected to the first node P1, an input terminal 1b that is connected to the first clock signal CLK1, and an output terminal that is connected to the second node P2. The second input unit 012 is configured to output the first clock signal CLK1 to the second node P2 under the control of the first node P1. As the first input module comprises the first input unit and the second input unit, the first signal and the first reference signal can be outputted by the first input unit to the first node and the second node respectively under the control of the first clock signal, and the first clock signal can be output by the second input unit to the second node under the control of the first node.

In the shift register unit as provided in an exemplary embodiment of the present disclosure, as shown in FIG. 2, the first input unit 011 may comprise an eighth switch transistor T8 and a ninth switch transistor T9. The eighth switch transistor T8 has a gate connected to the first clock signal CLK1, a source connected to the first signal STVE, and a drain connected to the first node P1. The ninth switch transistor T9 has a gate connected to the first clock signal CLK1, a source connected to the first reference signal VGL, and a drain connected to the second node P2. Thus, the eighth switch transistor may be turned on under the control of the first clock signal, so as to output the first signal to the first node. The ninth switch transistor may be turned on under the control of the first clock signal, so as to output the first reference signal to the second node.

In the shift register unit as provided in an exemplary embodiment of the disclosure, as shown in FIG. 2, the second input unit may comprise a tenth switch transistor T10 which has a gate connected to the first node P1, a source connected to the first clock signal CLK1, and a drain connected to the second node P2. Thus, the tenth switch transistor may be turned on under the control of the first node, so as to output the first clock signal to the second node.

In the shift register unit as provided in an exemplary embodiment of the present disclosure, as shown in FIG. 2, the second input module may comprise a third input unit 021 and a fourth input unit 022. The third input unit 021 has a control terminal 2a that is connected to the first clock signal CLK1, a first input terminal 2g that is connected to the first reference signal VGL, a second input terminal 2f that is connected to the second signal STVG, a first output terminal 2e that is connected to the third node P3, and a second output terminal 2c that is connected to the fourth node P4. The third input unit 021 is configured to output the second signal STVG and the first reference signal VGL respectively to the third node P3 and the fourth node P4 under the control of the first clock signal CLK1. The fourth input unit 022 has a control terminal 2d that is connected to the third node P3, an input terminal 2b that is connected to the first clock signal CLK1, and an output terminal that is connected to the fourth node P4. The fourth input unit 022 is configured to output the first clock signal CLK1 to the fourth node P4 under the control the third node P3. As the second input module comprises the third input unit and the fourth input unit, the second signal and the first reference signal can be output by the third input unit to the third node and to the fourth node respectively under the control of the first clock signal, the first clock signal can be output by the fourth input unit to the fourth node under the control of the third node.

In the shift register unit as provided in an exemplary embodiment of the present disclosure, as shown in FIG. 2, the third input unit may comprise an eleventh switch transistor T11 and a twelfth switch transistor T12. The eleventh switch transistor T11 has a gate connected to the first clock signal CLK1, a source connected to the second signal STVG, and a drain connected to the third node P3. The twelfth switch transistor T12 has a gate connected to the first clock signal CLK1, a source connected to the first reference signal VGL, and a drain connected to the fourth node P4. Thus, the eleventh switch transistor may be turned on under the control of the first clock signal, so as to provide the second signal to the third node. The twelfth switch transistor may be turned on under the control of the first clock signal, so as to provide the first reference signal to the fourth node.

In the shift register unit as provided in an exemplary embodiment of the present disclosure, as shown in FIG. 2, the fourth input unit may comprise a thirteenth switch transistor T13 which has a gate connected to the third node P3, a source connected to the first clock signal CLK1, and a drain connected to the fourth node P4. Thus, the thirteenth switch transistor may be turned on under the control of the third node, so as to output the first clock signal to the fourth node.

In the shift register unit as provided in an exemplary embodiment of the present disclosure, as shown in FIG. 2, the second control module may comprise a fourteenth switch transistor T14, a fifteenth switch transistor T15 and a sixteenth switch transistor T16. The fourteenth switch transistor T14 has a gate connected to the fourth node P4, a source connected to the second reference signal VGH, and a drain connected to a source of the fifteenth switch transistor T15 and a source of the sixteenth switch transistor T16 respectively. The fifteenth switch transistor T15 has a gate connected to the first node P1 and a drain connected to the third node P3. The sixteenth switch transistor T16 has a gate connected to the fifth node P5 and a drain connected to the third node P3. Thus, the fourteenth switch transistor may be turned on under the control of the fourth node, so as to provide the second reference signal to the source of the fifteenth switch transistor and to the source of the sixteenth switch transistor respectively. The fifteenth switch transistor may be turned on under the control of the first node, so as to output signals from the source thereof to the third node. The sixteenth switch transistor may be turned on under the control of the fifth node, so as to output signals from the source thereof to the third node.

It is noted that the switch transistors mentioned in the exemplary embodiments of the disclosure may be fin film transistors (TFT), or may be metal oxide semiconductors (MOS), which are not limited to those described herein. In the exemplary embodiments of the present disclosure, the source and the drain of the transistor may be exchangeable with each other and thus the disclosure does not distinguish between them. When it comes to an embodiment, let us consider TFT as an example for illustration Additionally, for the shift register units as provided in exemplary embodiments of the present disclosure, the first reference signal VGL as mentioned therein may be a signal of a low level, and the second reference signal VGH may be a signal of a high level. The first signal STVE may be a first trigger signal for generating the light emission signal EM, and the second signal STVG may be a second trigger signal for generating the scanning signal Gate.

Figure 3:
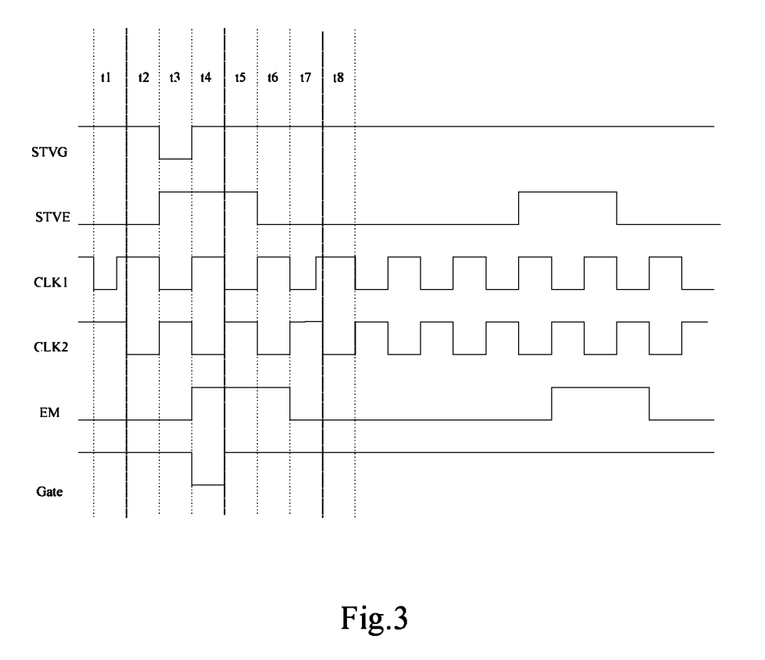
FIG. 3 is a view of operation sequence for a shift register unit as provided in an exemplary embodiment of the present disclosure.

The operation process of the shift register unit as provided in the exemplary embodiment of the present disclosure will be illustrated in detail as follows in conjunction with the circuitry structure and operation sequence for the shift register unit. Taking the shift register unit comprising P-type transistors as shown in FIG. 2 as an example, the operation process of the shift register unit as provided in the exemplary embodiment of the disclosure will be illustrated in conjunction with the sequence diagram shown in FIG. 3. As shown in FIG. 3, eight stages t1~t8 are included in the signal sequence diagram for the shift register unit. In the following, a high level is represented with "1", and a low level is indicated with "0".

At stage t1, STVE=0, STVG=1, CLK1=0, CLK2=1, VGL=0, VGH=1. As CLK1=0, each of the eighth switch transistor T8, the ninth switch transistor T9, the eleventh switch transistor T11 and the twelfth switch transistor T12 is turned on. Accordingly, the first signal STVE is output to the first node P1 via the eighth switch transistor T8. At this time, STVE=0, so the second switch transistor T2, the seventh switch transistor T7, the tenth switch transistor T10 and the fifteenth switch transistor T15 are turned on. The first reference signal VGL is provided to the light emission signal output terminal via the turned-on second switch transistor T2, and VGL=0, thus a low level signal is outputted by the light emission signal output terminal. The second reference signal VGH is provided to the fifth node P5 via the turned-on seventh switch transistor T7, which in turn enables the first switch transistor T1 to be turned off. The first reference signal VGL and the first clock signal CLK1 are provided to the second node P2 respectively by the turned-on ninth switch transistor T9 and tenth switch transistor T10. The turned-on eleventh switch transistor T11 provides the second signal STVG to the third node P3, and as STVG=1, the fourth switch transistor T4 is turned off under the control of the third node P3. The turned-on twelfth switch transistor T12 provides the first reference signal VGL to the fourth node P4, which in turn enables the third switch transistor T3 to be turned on under the control of the fourth node P4, such that the second reference signal VGH is provided to the scanning signal output terminal via the turned-on third switch transistor T3. VGH=1, therefore, a high level signal is outputted from the scanning signal output terminal. Meanwhile, the fourteenth switch transistor T14 is also in a turned-on state under the control of the fourth node P4, so the second reference signal VGH is provided to the third node P3 via the turned-on fourteenth switch transistor T14 and the turned-on fifteenth switch transistor T15 so as to maintain the third node P3 at a high level. At the second half of the stage t1, the first signal STVE, the second signal STVG and the second clock signal CLK2 keep constant, and the first clock signal CLK1 varies from a low level to a high level. At this time, the low level at the first node P1 may be maintained due to the presence of the capacitor C2. Therefore, the high level signal of the first clock signal CLK1 can be provided to the second node P2 by the tenth switch transistor T10, keeping the fifth switch transistor T15 in a turned-off state.

At stage t2, STVE=0, STVG=1, CLK1=1, CLK2=0, VGL=0, VGH=1. As CLK2=0, the sixth switch transistor T6 is turned on. Since the high level of the second node P2 at the second half of the stage t1 keeps the fifth switch transistor T5 in a turned-off state, the second node P2 is still at the high level during the stage t2 under the effect of the fifth capacitor C5, and the first reference signal VGL would not be provided to the fifth node P5 via the fifth switch transistor T5 and the sixth switch transistor T6. Consequently, the first node Pb remains at the low level at the last stage, the second switch transistor T2 and the seventh switch transistor T7 are in an on state, the potential of the fifth node P5 is a high level of VGH, the first switch transistor T1 remains in an off state, so that the light emission signal output terminal still outputs the first reference signal VGL. Meanwhile, the fourth node P4 remains at the low level at the last stage, so the third switch transistor T3 is in an on state, and the scanning signal output terminal outputs the second reference signal VGH.

At stage t3, STVE=1, STVG=0, CLK1=0, CLK2=1, VGL=0, VGH=1. As CLK1=0, the eighth switch transistor T8, the ninth switch transistor T9, the eleventh switch transistor T11 and the twelfth switch transistor T12 are turned on. Accordingly, the first signal STVE is provided to the first node P1 via the turned-on eighth switch transistor T8, whereby STVE=1 enables the second switch transistor T2, the seventh switch transistor T7, the tenth switch transistor T10 and the fifteenth switch transistor T15 to be turned off. The turned-on ninth switch transistor T9 provides the first reference signal VGL to the second node P2, whereby VGL=0 enables the fifth switch transistor T5 to be turned on. Moreover, at this time, CLK2=1, the sixth switch transistor T6 is turned off. The turned-on eleventh switch transistor T11 provides the second signal STVG to the third node P3. Since STVG=0, the fourth switch transistor T4 and the thirteenth switch transistor T13 are turned on under the control of the third node P3. The turned-on fourth switch transistor T4 provides the second clock signal terminal CLK2 to the scanning signal output terminal. At this time, CLK2=1, so a high level signal is outputted from the scanning signal output terminal. Meanwhile, the turned-on thirteenth switch transistor T13 provides the first clock signal CLK1 to the fourth node P4, and CLK1=0 at this moment, thus the third switch transistor T3 is turned on under the control of the fourth node P4, which enables the second reference signal VGH to be provided to the scanning signal output terminal. As VGH=1, a high level signal is outputted from the scanning signal output terminal. During this stage, both the first node P1 and the fifth node P5 are at a high level, so each of the first switch transistor T1 and the second switch transistor T2 is in an off state, and the light emission signal output terminal keeps the state at the last stage, i.e. outputs a low level signal.

At stage t4, STVE=1, STVG=1, CLK1=1, CLK2=0, VGL=0, VGH=1. As CLK2=0, the sixth switch transistor T6 is turned on. Due to the existence of the fifth capacitor C5, the second node P2 remains the low level at the last stage, so the fifth switch transistor T5 is in an on state, and the signal at the first reference signal terminal VGL is provided to the fifth node P5 via the turned-on fifth switch transistor T5 and sixth switch transistor T6. Hence, the first switch transistor T1 is turned on under the control of the fifth node P5, which in turn enables the second reference signal VGH to be provided to the light emission signal output terminal. At that time, as the signal of the second clock signal CLK2 has changed from the high level to the low level, the potential of the third node P3 is further pulled down because of the bootstrap effect by the coupling capacitor (i.e. the fourth capacitor C4) between the gate and source of the fourth switch transistor T4. Therefore, the fourth switch transistor T4 is turned on under the control of the third node P3, which enables the second clock signal CLK2 to be provided to the scanning signal output terminal. As CLK2=0, a low level signal is outputted from the scanning signal output terminal. In addition, the thirteenth switch transistor T13 is turned on under the control of the third node P3 and provides the first clock signal CLK1 to the fourth node P4. At this time, CLK1=1, the fourth node P4 is kept at a high level, so the third switch transistor T3 is in an off state.

At stage t5, STVE=1, STVG=1, CLK1=0, CLK2=1, VGL=0, VGH=1. As CLK1=0, each of the eighth switch transistor T8, the ninth switch transistor T9, the eleventh switch transistor T11 and the twelfth switch transistor T12 is turned on. The turned-on eighth switch transistor T8 outputs the first signal STVE to the first node P1. STVE=1, so each of the second switch transistor T2, the seventh switch transistor T7, the tenth switch transistor T10 and the fifteenth switch transistor T15 is turned off. The turned-on ninth switch transistor T9 outputs the first reference signal VGL to the second node P2, and the turned-on eleventh switch transistor T11 outputs the second signal STVG to the third node P3. Because STVG=1 at this time, the thirteenth switch transistor T13 and the fourth switch transistor T4 are turned off. The turned-on twelfth switch transistor T12 outputs the first reference signal VGL to the fourth node P4, so the third switch transistor T3 and the fourteenth switch transistor T14 are turned on, with the turned-on third switch transistor T3 outputting the second reference signal VGH to the scanning signal output terminal. Meanwhile, the fifth node P5 remains the low level at the previous stage, so the first switch transistor T1 and the sixteenth switch transistor T16 are turned on, with the turned-on first switch transistor T1 outputting the second reference signal VGH to the light emission signal output terminal. In addition, the second reference signal VGH is provided to the third node P3 via the turned-on fourteenth switch transistor T14 and sixteenth switch transistor T16, further keeping the high level at the third node P3.

At stage t6, STVE=0, STVG=1, CLK1=1, CLK2=0, VGL=0, VGH=1. As CLK2=0, the sixth switch transistor T6 is turned on. Due to the existence of the fifth capacitor C5, the second node P2 remains at the low level at the previous stage, so the fifth switch transistor T5 is in an on state. The first reference signal VGL is provided to the fifth node P5 via the turned-on fifth switch transistor T5 and sixth switch transistor T6, so that the first switch transistor T1 and the sixteenth switch transistor T16 are turned on, with the turned-on first switch transistor T1 outputting the second reference signal VGH to the light emission signal output terminal.

Meanwhile, the fourth node P4 keeps the low level at the previous stage, so the third switch transistor T3 and the fourteenth switch transistor T14 are turned on, with the turned-on third switch transistor T3 outputting the second reference signal VGH to the scanning signal output terminal. The second reference signal VGH is provided to the third node P3 via the turned-on fourteenth switch transistor T14 and sixteenth switch transistor T16, further keeping the third node P3 at the high level.

At stage t7, STVE=0, STVG=1, CLK1=0, CLK2=1, VGL=0, VGH=1. As CLK1=0, each of the eighth switch transistor T8, the ninth switch transistor T9, the eleventh switch transistor T11 and the twelfth switch transistor T12 is turned on. The turned-on eighth switch transistor T8 outputs the first signal STVE to the first node P1. At this moment, STVE=0, so the second switch transistor T2, the seventh switch transistor T7, the tenth switch transistor T10 and the fifteenth switch transistor T15 are turned on. The turned-on second switch transistor T2 outputs the first reference signal VGL to the light emission signal output terminal, thus the light emission signal output terminal outputs a low level signal. The turned-on seventh switch transistor T7 outputs the second reference signal VGH to the fifth node P5, thus the first switch transistor T1 is turned off. The turned-on ninth switch transistor T9 and tenth switch transistor T10 respectively output the first reference signal VGL and the first clock signal CLK1 to the second node P2. The turned-on eleventh switch transistor T11 provides the second signal STVG to the third node P3. STVG=1, so the fourth switch transistor T4 is turned off under the control of the third node P3. The turned-on twelfth switch transistor T12 provides the first reference signal VGL to the fourth node P4, thus the third switch transistor T3 is turned on, so as to provide the second reference signal VGH to the scanning signal output terminal. Since VGH=1, a high level signal is provided from the scanning signal output terminal. Meanwhile, the fourteenth switch transistor T14 is also in an on state under the control of the fourth node P4. The turned-on fourteenth switch transistor T14 and the turned-on fifteenth switch transistor T15 provide the second reference signal VGH to the third node P3, such that the third node P3 keeps a high level. During the stage t7, the first signal STVE, the second signal STVG and the second clock signal CLK2 keep constant, and the first clock signal CLK1 varies from a low level to a high level. At this time, the high level signal of the first clock signal CLK1 is outputted to the second node P2 via the turned-on tenth switch transistor T10, so as to enable the fifth switch transistor T5 to be in an off state.

At stage t8, STVE=0, STVG=1, CLK1=1, CLK2=0, VGL=0, VGH=1. As CLK2=0, the sixth switch transistor T6 is turned on. At the end of the stage t7, the second node P2 has a potential of high level and the fifth switch transistor T5 is in the off state, therefore, at the stage t8, the second node P2 remains at a high level due to the effect by the fifth capacitor C5. Thus, the first reference signal VGL will not be provided to the fifth node P5 via the fifth switch transistor T5 and the sixth switch transistor T6. The first node P1 remains at the low level at the previous stage, the second switch transistor T2 and the seventh switch transistor T7 are in the on state. The fifth node P5 has a potential of the high level VGH, and the first switch transistor T1 is still in the off state, hence the light emission signal output terminal still outputs the first reference signal VGL. Meanwhile, the fourth node P4 keeps the low level at the previous stage, so the third switch transistor T3 is in the on state, and the scanning signal output terminal outputs the second reference signal VGH.

In subsequent stages, when the first signal STVE is at low level, operation states during the stages T7 and T8 will be repeated. When the first signal STVE changes into a high level signal again, the operation states during the stages T3, T4 and T5 will be repeated until the first signal STVE once again changes from the high level signal to the low level signal. Thereafter, the process of stages t7 and t8 will reoccur after experiencing the process of the stage t6. During the stage t3, the first signal STVE remains at a high level, the second clock signal CLK2 remains at a high level, and the second signal STVG and the first clock signal CLK1 are in low level, hence, the eighth switch transistor T8, the ninth switch transistor T9, the eleventh switch transistor T11 and the twelfth switch transistor T12, which are controlled by the first clock signal CLK1, are turned on. The turned-on twelfth switch transistor T12 writes the first reference signal VGL into the fourth P4 so as to turn on the third switch transistor T3. Consequently, the second reference signal VGH is provided to the scanning signal output terminal. Meanwhile, the second signal STVG of a low level is outputted to the third node P3, so as to turn on the thirteenth switch transistor T13 and the fourth switch transistor T4, with the turned on fourth switch transistor T4 providing the second clock signal CLK2 to the scanning signal output terminal. As CLK2=1 at this moment, a high level signal is provided from the scanning signal output terminal. As the eighth switch transistor T8 is turned on, the first signal STVE is provided to the first node P1. At this time, STVE=1, the first node P1 has a potential of high level, thereby turning off the second switch transistor T2. Moreover, as the fifth node P5 keeps a high level at the previous stage, the first switch transistor T1 is in the off state, the light emission signal output terminal keeps a state of the previous stage, i.e. outputs the low level signal. Subsequent to the stage t3 are stages t4 and t5, during which the light emission signal output terminal continuously outputs a high level signal of the second reference signal VGH. In this way, it is enabled to provide a light emission signal having multiple pulse widths at the light emission signal output terminal, i.e. a duty ratio control for the light emission signal is achieved.

Based on the same concept, a gate drive circuit is provided in another exemplary embodiment of the present disclosure, comprising a plurality of cascaded shift register units according to any one of the preceding exemplary embodiments of the disclosure. Among the cascaded shift register units, apart from the last one, the light emission signal output terminal of each shift register unit is connected to a next subsequent shift register unit to provide the first signal for this next subsequent shift register unit, the scanning signal output terminal of each shift register unit is connected to a next subsequent shift register unit to provide the second signal for this next subsequent shift register unit.

Figure 4:
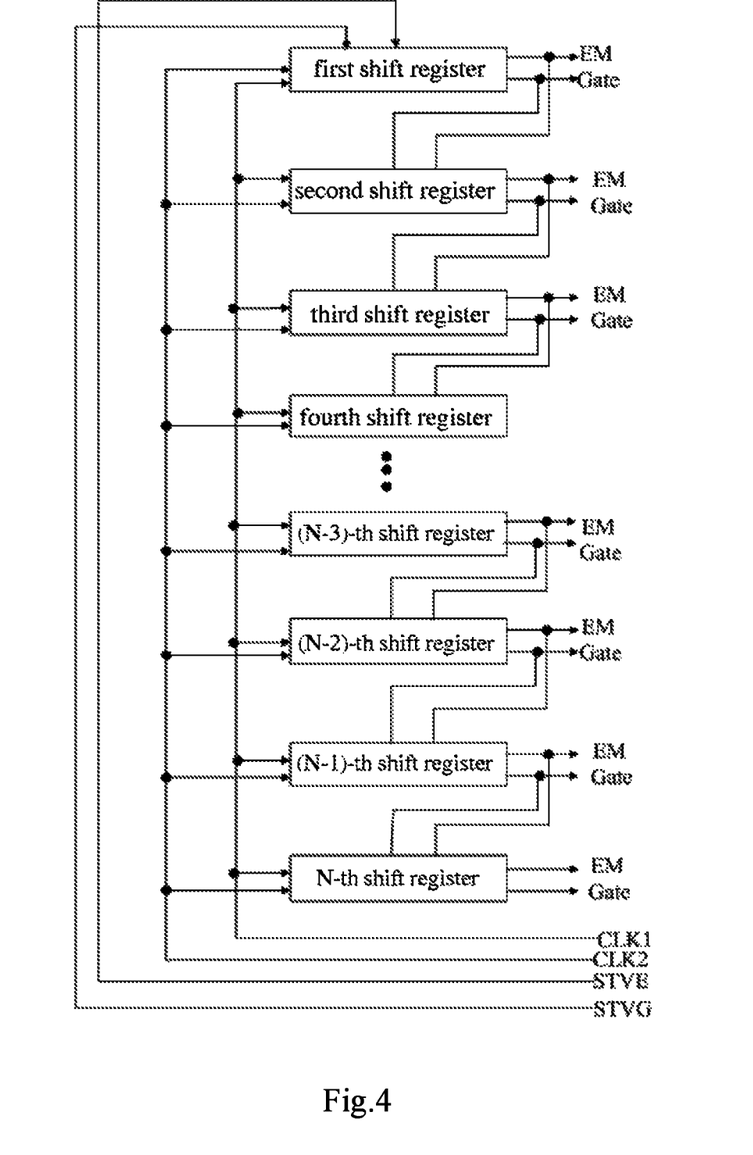
FIG. 4 is a structural schematic view of a gate drive circuit as provided in an exemplary embodiment of the present disclosure.

To be convenient for explanation, FIG. 4 only shows eight cascaded shift register units, i.e. the first shift register unit, the second shift register unit, the third shift register unit, the fourth shift register unit, the (N−3)-th shift register unit, the (N−2)-th shift register unit, the (N−1)-th shift register unit, and the N-th shift register unit. A light emission signal EM from the light emission signal output terminal of the (N−1)-th shift register unit is provided to the N-th shift register unit as the first signal for the N-th shift register unit, and the scanning signal Gate from the scanning signal output terminal is provided to the N-th shift register unit as the second signal for the N-th shift register unit. The connection positions of the first clock signal CLK1 and the second clock signal CLK2 for a shift register unit are exchanged with those for the next subsequent shift register unit. By way of example, referring to the exemplary embodiment as shown in FIG. 2, for a N-th shift register unit, the first clock signal CLK1 is connected to the control terminal 1a, and the second clock signal CLK2 is connected to the input terminal 6d, then for the (N+1)-th shift register unit, the first clock signal CLK1 is connected to the input terminal 6d, and the second clock signal CLK2 is connected to the control terminal 1a, so as to achieve an effect of phase shifting from top to down.

Based on the same concept, a display panel is provided in another exemplary embodiment of the present disclosure, comprising the gate drive circuit according to the exemplary embodiment of the disclosure. As the principle to solve problems for display panel is similar to the gate drive circuit, the display panel may be implemented with reference to the above gate drive circuit, thus the details will not be repeated herein.

Based on the same concept, a display device is provided in a further exemplary embodiment of the disclosure, comprising the display panel according to the exemplary embodiment of the disclosure. The display device may be any product or component having displaying function, such as a mobile phone, a tablet computer, a TV, a display, a notebook, a digital photo frame, a navigator, etc. As the principle to solve problems for the display device is similar to the display panel, the display device may be implemented with reference to the display panel, thus the details will not be repeated herein.

A shift register unit, a gate drive circuit, a display panel and a display device are provided in exemplary embodiments of the present disclosure. The shift register unit comprises a first input module, a second input module, a first control module, a second control module, a light emission signal output module and a scanning signal output module. The first input module is configured to output the first signal and the first reference signal respectively to the first node and the second node under the control of the first clock signal, and output the first clock signal to the second node under the control of the first node. The second input module is configured to output the second signal and the first reference signal respectively to the third node and the fourth node under the control of the first clock signal, and output the first clock signal to the fourth node under the control of the third node. The first control module is configured to output the first reference signal to the fifth node under the control of the second node and the second clock signal, and output the second reference signal to the fifth node under the control of the first node. The second control module is configured to output the second reference signal to the third node under the control of the fourth node, the first node and the fifth node. The light emission signal output module is configured to output the first reference signal or the second reference signal to the light emission signal output terminal under the control of the first node and the fifth node. The scanning signal output module is configured to output the second reference signal or the second clock signal to the scanning signal output terminal under the control of the third node and the fourth node.

With respect to the shift register units as provided in exemplary embodiments of the present disclosure, respective signals can be generated from each module under the control of the respective control signal terminal of the module, so that the scanning signals and light emission signals can be generated. Meanwhile, the light emission signal output module and the scanning signal output module are combined with each other, so as to integrate the light emission shift register unit and the scanning shift register unit into one circuit configuration, thereby reducing the number of clock signals as required. Moreover, in the shift register unit as provided in exemplary embodiments of the present disclosure, the light emission signal output module and the scanning signal output module may be synchronously driven. The light emission signal output module may continuously output the first reference signal or the second reference signal by controlling potentials of the first node and of the second node. The scanning signal output module may continuously output the second reference signal or the second clock signal by controlling potentials of the third node and of the fourth node. In this way, a light emission signal having several pulse widths can be generated. That is to say, the duty ratio control to the light emission signal is not only achieved, but also the light emission shift register unit and the scanning shift register unit are integrated into one circuit configuration.

It is apparent that those skilled in the art can make various modifications and variations to the present disclosure without departing from the spirit and scope of the invention. In this way, if these modifications and variations of the present disclosure fall within the scope of the claims and equivalents thereof, the present invention intends to encompass these modifications and variations.

The invention claimed is:

1. A shift register unit, comprising a first input module, a second input module, a first control module, a second control module, a light emission signal output module and a scanning signal output module, wherein the first input module has a first control terminal and a first input terminal that are respectively used for connecting to a first clock signal, a second control terminal and a first output terminal that are respectively connected to a first node, a second input terminal that is connected to a first signal, a third input terminal for receiving a first reference signal, and a second output terminal that is connected to a second node, wherein the first input module is configured to output the first signal and the first reference signal respectively to the first node and the second node under the control of the first clock signal, and output the first clock signal to the second node under the control of the first node, wherein the second input module has a first control terminal and a first input terminal that are respectively used for connecting to the first clock signal, a second control terminal and a first output terminal that are respectively connected to a third node, a second input terminal that is connected to a second signal, a third input terminal for receiving the first reference signal, and a second output terminal that is connected to a fourth node, wherein the second input module is configured to output the second signal and the first reference signal respectively to the third node and the fourth node under the control of the first clock signal, and output the first clock signal to the fourth node under the control of the third node, wherein the first control module has a first control terminal that is connected to the second node, a second control terminal for receiving a second clock signal, a third control terminal that is connected to the first node, a first input terminal for receiving a second reference signal, a second input terminal for receiving the first reference signal, and an output terminal that is connected to a fifth node, wherein the first control module is configured to output the first reference signal to the fifth node under the control of the second node and the second clock signal, and output the second reference signal to the fifth node under the control of the first node, wherein the second control module has a first control terminal that is connected to the fourth node, a second control terminal that is connected to the first node, a third control terminal that is connected to the fifth node, an input terminal for receiving the second reference signal, and an output terminal that is connected to the third node, wherein the second control module is configured to output the second reference signal to the third node under the control of the fourth node, the first node and the fifth node, wherein the light emission signal output module has a first control terminal that is connected to the first node, a second control terminal that is connected to the fifth node, a first input terminal for receiving the first reference signal, a second input terminal for receiving the second reference signal, and a light emission signal output terminal, wherein the light emission signal output module is configured to output one of the first reference signal and the second reference signal to the light emission signal output terminal under the control of the first node and the fifth node, wherein the scanning signal output module has a first control terminal that is connected to the third node, a second control terminal that is connected to the fourth node, a first input terminal for receiving the second reference signal, a second input terminal for receiving the second clock signal, and a scanning signal output terminal, wherein the scanning signal output module is configured to output one of the second reference signal and the second clock signal to the scanning signal output terminal under the control of the third node and the fourth node.

2. The shift register unit according to claim 1, wherein the light emission signal output module comprises a first output unit and a second output unit, wherein the first output unit has a control terminal that acts as the second control terminal of the light emission signal output module, and an input terminal that acts as the second input terminal of the light emission signal output module, wherein the first output unit is configured to output the second reference signal to the light emission signal output terminal under the control of the fifth node, wherein the second output unit has a control terminal that acts as the first control terminal of the light emission signal output module, and an input terminal that acts as the first input terminal of the light emission signal output module, wherein the second output unit is configured to output the first reference signal to the light emission signal output terminal under the control of the first node.

3. The shift register unit according to claim 2, wherein the first output unit comprises a first switch transistor and a first capacitor, wherein the first switch transistor has a gate connected to the fifth node, a source for receiving the second reference signal, and a drain connected to the light emission signal output terminal, and the first capacitor is connected between the second reference signal and the fifth node.

4. The shift register unit according to claim 2, wherein the second output unit comprises a second switch transistor and a second capacitor, wherein the second switch transistor has a gate connected to the first node, a source for receiving the first reference signal, and a drain connected to the light emission signal output terminal, and the second capacitor is connected between the first node and the light emission signal output terminal.

5. The shift register unit according to claim 1, wherein the scanning signal output module comprises a third output unit and a fourth output unit,
wherein the third output unit has a control terminal that acts as the second control terminal of the scanning signal output module, and an input terminal that acts as the first input terminal of the scanning signal output module, wherein the third output unit is configured to output the second reference signal to the scanning signal output terminal under the control of the fourth node,
wherein the fourth output unit has a control terminal that acts as the first control terminal of the scanning signal output module, and an input terminal that acts as the second input terminal of the scanning signal output module, wherein the fourth output unit is configured to output the second clock signal to the scanning signal output terminal under the control of the third node.

6. The shift register unit according to claim 5, wherein the third output unit comprises a third switch transistor and a third capacitor, wherein the third switch transistor has a gate connected to the fourth node, a source for receiving the second reference signal, and a drain connected to the scanning signal output terminal, and the third capacitor is connected between the fourth node and the second reference signal.

7. The shift register unit according to claim 5, wherein the fourth output unit comprises a fourth switch transistor and a fourth capacitor, wherein the fourth switch transistor has a gate connected to the third node, a source for receiving the second clock signal, and a drain connected to the scanning signal output terminal, and the fourth capacitor is connected between the third node and the scanning signal output terminal.

8. The shift register unit according to claim 1, wherein the first control module comprises a first control unit and a second control unit, wherein the first control unit has a first control terminal and a second terminal that respectively act as the first control terminal and the second control terminal of the first control module, and an input terminal that acts as the second input terminal of the first control module, wherein the first control unit is configured to output the first reference signal to the fifth node under the control of the second node and the second clock signal,
wherein the second control unit has a control terminal that acts as the third control terminal of the first control module, and an input terminal that acts as the first input terminal of the first control module, wherein the second control unit is configured to output the second reference signal to the fifth node under the control of the first node.

9. The shift register unit according to claim 8, wherein the first control unit comprises a fifth switch transistor, a sixth switch transistor and a fifth capacitor,
wherein the fifth switch transistor has a gate connected to the second node, a source for receiving the first reference signal, and a drain connected to a source of the sixth switch transistor, the sixth switch transistor has a gate for receiving the second clock signal and a drain connected to the fifth node, wherein the fifth capacitor is connected between the second node and the second clock signal.

10. The shift register unit according to claim 8, wherein the second control unit comprises a seventh switch transistor, which has a gate connected to the first node, a source for receiving the second reference signal and a drain connected to the fifth node.

11. The shift register unit according to claim 1, wherein the first input module comprises a first input unit and a second input unit,
wherein the first input unit has a control terminal that acts as the first control terminal of the first input module, a first input terminal that acts as the third input terminal of the first input module, and a second input terminal that acts as the second input terminal of the first input module, wherein the first input unit is configured to output the first signal and the first reference signal respectively to the first node and the second node under the control of the first clock signal,
wherein the second input unit has a control terminal that acts as the second control terminal of the first input module, and an input terminal that acts as the first input terminal of the first input module, wherein the second input unit is configured to output the first clock signal to the second node under the control of the first node.

12. The shift register unit according to claim 11, wherein the first input unit comprises an eighth switch transistor and a ninth switch transistor,
wherein the eighth switch transistor has a gate for receiving the first clock signal, a source connected to the first signal, and a drain connected to the first node, wherein the ninth switch transistor has a gate for receiving the first clock signal, a source for receiving the first reference signal, and a drain connected to the second node.

13. The shift register unit according to claim 11, wherein the second input unit comprises a tenth switch transistor which has a gate connected to the first node, a source for receiving the first clock signal, and a drain connected to the second node.

14. The shift register unit according to claim 1, wherein the second input module comprises a third input unit and a fourth input unit,
wherein the third input unit has a control terminal that acts as the first control terminal of the second input module, a first input terminal that acts as the third input terminal of the second input module, and a second input terminal that acts as the second input terminal of the second input module, wherein the third input unit is configured to output the second signal and the first reference signal respectively to the third node and the fourth node under the control of the first clock signal, wherein the fourth input unit has a control terminal that acts as the second control terminal of the second input module, and an input terminal that acts as the first input terminal of the second input module, wherein the fourth input unit is configured to output the first clock signal to the fourth node under the control of the third node.

15. The shift register unit according to claim 14, wherein the third input unit comprises an eleventh switch transistor and a twelfth switch transistor, wherein the eleventh switch transistor has a gate for receiving the first clock signal, a source connected to the second signal, and a drain connected to the third node, wherein the twelfth switch transistor has a gate for receiving the first clock signal, a source for receiving the first reference signal, and a drain connected to the fourth node.

16. The shift register unit according to claim 14, wherein the fourth input unit comprises a thirteenth switch transistor which has a gate connected to the third node, a source for receiving the first clock signal, and a drain connected to the fourth node.

17. The shift register unit according to claim 1, wherein the second control module comprises a fourteenth switch transistor, a fifteenth switch transistor and a sixteenth switch transistor, wherein the fourteenth switch transistor has a gate connected to the fourth node, a source for receiving the second reference signal, and a drain connected to a source of the fifteenth switch transistor and a source of the sixteenth switch transistor respectively, wherein the fifteenth switch transistor has a gate connected to the first node and a drain connected to the third node, wherein the sixteenth switch transistor has a gate connected to the fifth node and a drain connected to the third node.

18. A gate drive circuit, comprising a plurality of cascaded shift register units according to claim 1, among the cascaded shift register units, apart from the last shift register unit, the light emission signal output terminal of each shift register unit is connected to a next subsequent shift register unit to provide the first signal for this next subsequent shift register unit, the scanning signal output terminal of each shift register unit is connected to a next subsequent shift register unit to provide the second signal for this next subsequent shift register unit.

19. The gate drive circuit according to claim 18, wherein the first signal and the second signal that are provided to a first shift register unit among the cascaded shift register units are a first trigger signal for generating the light emission signal and a second trigger signal for generating the scanning signal, respectively.

20. A display panel, comprising the gate drive circuit according to claim 19.

\* \* \* \* \*